(12) United States Patent
Angerer

(10) Patent No.: US 8,957,489 B2
(45) Date of Patent: Feb. 17, 2015

(54) COMPONENT ARRANGEMENT AND METHOD FOR PRODUCING A COMPONENT ARRANGEMENT

(75) Inventor: Roman Angerer, Bad Reichenhall (DE)

(73) Assignee: Dr. Johannes Heidenhain GmbH, Traunreut (DE)

(*) Notice: Subject to any disclaimer, the term of this patent is extended or adjusted under 35 U.S.C. 154(b) by 546 days.

(21) Appl. No.: 12/934,797

(22) PCT Filed: Mar. 3, 2009

(86) PCT No.: PCT/EP2009/052497
§ 371 (c)(1),
(2), (4) Date: Sep. 27, 2010

(87) PCT Pub. No.: WO2009/121675
PCT Pub. Date: Oct. 8, 2009

(65) Prior Publication Data
US 2011/0024920 A1    Feb. 3, 2011

(30) Foreign Application Priority Data
Apr. 3, 2008 (DE) .......................... 10 2008 017 012

(51) Int. Cl.
*H01L 31/0203* (2014.01)
*H01L 23/24* (2006.01)
(Continued)

(52) U.S. Cl.
CPC ....... *H01L 23/24* (2013.01); *H01L 2924/01033* (2013.01); *H01L 24/45* (2013.01);
(Continued)

(58) Field of Classification Search
CPC .............. B82Y 10/00; H01L 27/14643; H01L 31/0203; H01L 2924/01006; H01L 23/3121; H01L 2224/48699; H01L 2224/48091; H01L 2224/8592; H01L 2924/014; H01L 2924/00014; H01L 2224/45124; H01L 23/24; G01J 1/42
USPC .................. 257/414, 431, 433, 434, 678, 680, 257/E27.124, E27.125, E27.126, E25.009, 257/E25.007, 702; 250/200, 216, 214.1; 438/478, 106, 127
See application file for complete search history.

(56) References Cited

U.S. PATENT DOCUMENTS 5,132,773 A * 7/1992 Braden et al. ................. 257/702
6,143,588 A   11/2000 Glenn
(Continued)

FOREIGN PATENT DOCUMENTS

DE    101 53 211 A1    1/2003
JP    58 107657 A      6/1983
JP    61 102758 A      5/1986

*Primary Examiner* — Galina Yushina
(74) *Attorney, Agent, or Firm* — Brinks Gilson & Lione

(57) ABSTRACT

A component assembly including a carrier element including a first contact face and a semiconductor component disposed on the carrier element, wherein the semiconductor component includes a second contact face. The component assembly further includes a contact-making bonding wire, wherein one end of the contact-making bonding wire is connected to the first contact face and a second end of the contact-making bonding wire is connected to the second contact face. The component assembly includes a flow stop bonding wire positioned on the second contact face, wherein the flow stop bonding wire defines on the second contact face a first zone and a second zone. An encapsulation material is applied from the first zone to the first contact face so as to define an encapsulation for the flow stop bonding wire, wherein the flow stop bonding wire prevents an uncontrolled flow of the encapsulation material into the second zone.

22 Claims, 6 Drawing Sheets

(51) Int. Cl.
*H01L 23/31* (2006.01)
*H01L 23/00* (2006.01)

(52) U.S. Cl.
CPC ............... *H01L2224/48091* (2013.01); *H01L 2224/48227* (2013.01); *H01L 2924/01082* (2013.01); *H01L 2924/01013* (2013.01); *H01L 2924/01006* (2013.01); *H01L 2224/48464* (2013.01); *H01L 23/3121* (2013.01); *H01L 2224/45124* (2013.01); *H01L 24/48* (2013.01); *H01L 2224/48699* (2013.01); *H01L 2924/01079* (2013.01); *H01L 2224/8592* (2013.01); *H01L 23/3185* (2013.01); *H01L 2924/014* (2013.01); *H01L 2924/01005* (2013.01)
USPC ........... 257/433; 257/414; 257/431; 257/678; 257/E23.116; 257/E27.125; 250/216; 250/200; 250/214.1; 438/478; 438/106; 438/127

(56) References Cited

U.S. PATENT DOCUMENTS

| | | | |
|---|---|---|---|
| 6,268,644 B1* | 7/2001 | Umehara et al. | 257/667 |
| 7,078,264 B2 | 7/2006 | Yang | |
| 7,149,091 B2 | 12/2006 | Ochi et al. | |
| 7,187,067 B2* | 3/2007 | Weng et al. | 257/680 |
| 7,224,070 B2 | 5/2007 | Yang | |
| 7,622,812 B2* | 11/2009 | Tsuduki et al. | 257/787 |
| 2003/0145461 A1* | 8/2003 | Kasai et al. | 29/832 |
| 2004/0212061 A1* | 10/2004 | Ochi et al. | 257/678 |
| 2004/0212082 A1 | 10/2004 | Yang | |
| 2005/0046044 A1* | 3/2005 | Theuss | 257/787 |
| 2005/0093178 A1 | 5/2005 | Huang et al. | |
| 2008/0061313 A1* | 3/2008 | Yen | 257/99 |

* cited by examiner

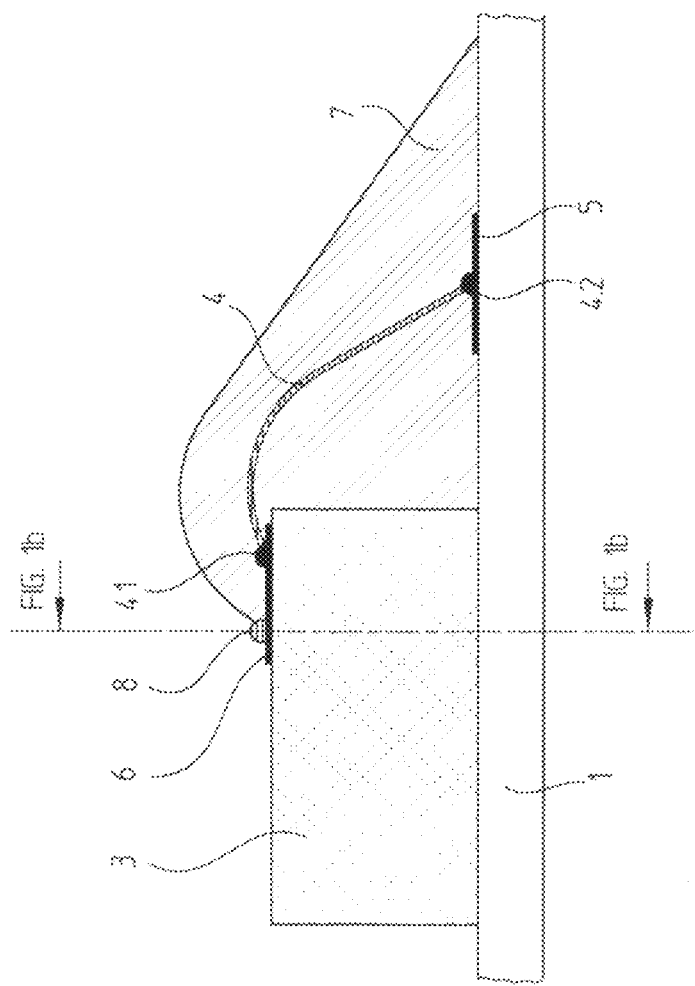
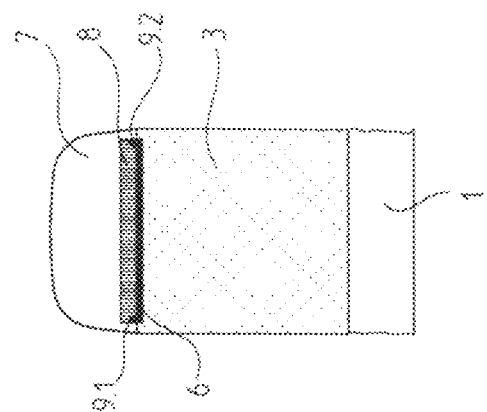
FIG. 1a
FIG. 1b

COMPONENT ARRANGEMENT AND METHOD FOR PRODUCING A COMPONENT ARRANGEMENT

Applicant claims, under 35 U.S.C. §§120 and 365, the benefit of priority of the filing date of Mar. 3, 2009 of a Patent Cooperation Treaty patent application, copy attached, Serial Number PCT/EP2009/052497, filed on the aforementioned date, the entire contents of which are incorporated herein by reference, wherein Patent Cooperation Treaty patent application Serial Number PCT/EP2009/052497 was not published under PCT Article 21(2) in English.

Applicant claims, under 35 U.S.C. §119, the benefit of priority of the filing date of Apr. 3, 2008 of a German patent application, copy attached, Serial Number 10 2008 017 012.7, filed on the aforementioned date, the entire contents of which are incorporated herein by reference.

BACKGROUND OF THE INVENTION

1. Field of the Invention

The present invention relates to a component assembly and to a method for producing a component assembly.

2. Description of the Related Art

An optoelectronic component assembly is known for instance from U.S. Pat. No. 7,149,091 B2. In it, a semiconductor component is disposed on a carrier element and is connected electrically, via a plurality of contact-making bonding wires, to at least one exposed contact face on the carrier element. The contact-making bonding wires are embedded together with the semiconductor component entirely in an encapsulation, which includes a suitable encapsulation material. A flow stop is also provided, which prevents an uncontrolled flow of the encapsulation around the semiconductor component on the carrier element before the solder material has hardened. As the flow stop, in U.S. Pat. No. 7,149,091 B2, planar conductor tracks disposed around the semiconductor component are provided on the carrier element, protruding slightly from the carrier element. This embodiment does make it possible to dispense with a separate flow stop, such as the application of one or more separate dams around the respective semiconductor component. However, this causes restrictions in the layout of the conductor tracks on the carrier element if the conductor tracks must additionally function as a flow stop. Moreover, applying the conductor tracks or flow stop requires complicated metallizing via a masking process.

SUMMARY AND OBJECTS OF THE INVENTION

It is therefore an object of the present invention to disclose a component assembly and a suitable method for its production wherein it is ensured that an encapsulation for protecting contact-making bonding wires is prevented from flowing as much as possible, without complicated additional provisions.

The object stated is attained by a component assembly including a carrier element including a first contact face and a semiconductor component disposed on the carrier element, wherein the semiconductor component includes a second contact face. The component assembly further includes a contact-making bonding wire, wherein one end of the contact-making bonding wire is connected to the first contact face and a second end of the contact-making bonding wire is connected to the second contact face. The component assembly includes a flow stop bonding wire positioned on the second contact face, wherein the flow stop defines on the second contact face a first zone and a second zone. An encapsulation material is applied from the first zone to the first contact face so as to define an encapsulation for the flow stop bonding wire, wherein the flow stop bonding wire prevents an uncontrolled flow of the encapsulation material into the second zone.

The object stated is attained by a method for producing a component assembly that includes disposing a semiconductor component on a carrier element and connecting the semiconductor component electrically to a contact face on the carrier element via a contact-making bonding wire. The method includes applying an encapsulation that has an encapsulation material so that the contact-making bonding wire is embedded within the encapsulation. The method further includes before the applying the encapsulation process, disposing a flow stop bonding wire as a flow stop at a boundary between a surface of the encapsulation and the contact face of the semiconductor component.

According to the present invention, it is now provided that as a flow stop, a flow stop bonding wire is disposed in the boundary zone between the semiconductor component and the encapsulation. Preferably, the slow stop bonding wire is disposed at the boundary between the surface of the encapsulation and the component-side contact face of the semiconductor component. The flow stop bonding wire can also be applied in the bonding process that is also necessary for making electrical contact, so that a reliable flow stop can be attained without major additional expense for process technology.

The component assembly of the present invention includes a carrier element, on which a semiconductor component is disposed, the semiconductor component being connected electrically to at least one contact face on the carrier element via at least one contact-making bonding wire. The contact-making bonding wire is embedded in an encapsulation that includes an encapsulation material. Via a flow stop, at least in a partial zone, uncontrolled flowing of the encapsulation material is prevented. At the boundary between the surface of the encapsulation and the component-side contact face of the semiconductor component, at least one flow stop bonding wire is disposed as a flow stop.

Preferably, the contact-making bonding wire and the flow stop bonding wire include the same material.

Advantageously, the flow stop bonding wire and the contact-making bonding wire have the same diameter.

In one possible embodiment, in addition, one or more further flow stop bonding wires are also disposed in other directions on the carrier element, which prevent an uncontrolled flow of the encapsulation material on the carrier element in these directions as well.

The flow stop bonding wire, in an advantageous embodiment, is disposed on the top side of the semiconductor component.

In that case, the component-side contact of the contact-making bonding wire is for instance disposed on the top side of the semiconductor component, between the flow stop bonding wire and the periphery of the semiconductor component.

The flow stop bonding wire is preferably fixed on its two ends.

It has furthermore proved advantageous if the flow stop bonding wire is disposed parallel to that side of the semiconductor component that is oriented toward the encapsulation.

In a possible variant, the semiconductor component is embodied as a photocell.

Advantageously, the encapsulation covers the component-side and the substrate-element-side contact face of the contact-making bonding wire on the semiconductor component and on the carrier element.

In a possible embodiment, the flow stop bonding wire is disposed with both ends on the component-side contact face of the semiconductor component.

It is also possible for the flow stop bonding wire to be fixed at at least one further point on the component-side contact face of the semiconductor component.

It can furthermore be provided that on the component-side contact face of the semiconductor component, a dam is embodied as a further flow stop, which is bounded on one side by the flow stop bonding wire.

In the context of the method of the present invention for producing a component assembly, first a semiconductor component is disposed on a carrier element. Then, the semiconductor component is connected electrically, via at least one contact-making bonding wire, to at least one contact face on the carrier element. Next, an encapsulation, including an encapsulation material, is applied, in which the contact-making bonding wire is embedded. Before the application of the encapsulation, at least in the boundary zone between the semiconductor component and the encapsulation, or at the boundary between the surface of the encapsulation and the component-side contact face of the semiconductor component, at least one flow stop bonding wire is disposed as a flow stop.

Preferably, the contact-making bonding wire and the flow stop bonding wire are applied via a bonding process.

Preferably, the flow stop bonding wire is disposed on the top side of the semiconductor component.

Advantageously, the component-side contact of the contact-making bonding wire is disposed on the top side of the semiconductor component, between the flow stop bonding wire and the periphery of the semiconductor component.

Preferably, the component-side contact face and the substrate-element-side contact face of the contact-making bonding wire on the semiconductor component and on the carrier element are covered via the encapsulation.

Finally, it proves advantageous if the flow stop bonding wire is fixed on its two ends.

Further advantages as well as details of the present invention will become apparent from the ensuing description of exemplary embodiments in conjunction with the accompanying drawings.

BRIEF DESCRIPTION OF THE DRAWINGS

In the drawings

FIG. 1a is a schematic first sectional view of a first exemplary embodiment of a component assembly in accordance with the present invention;

FIG. 1b is a schematic second sectional view of the component assembly of FIG. 1a;

DESCRIPTION OF THE PREFERRED
EMBODIMENT(S) OF THE INVENTION

Figure 2:
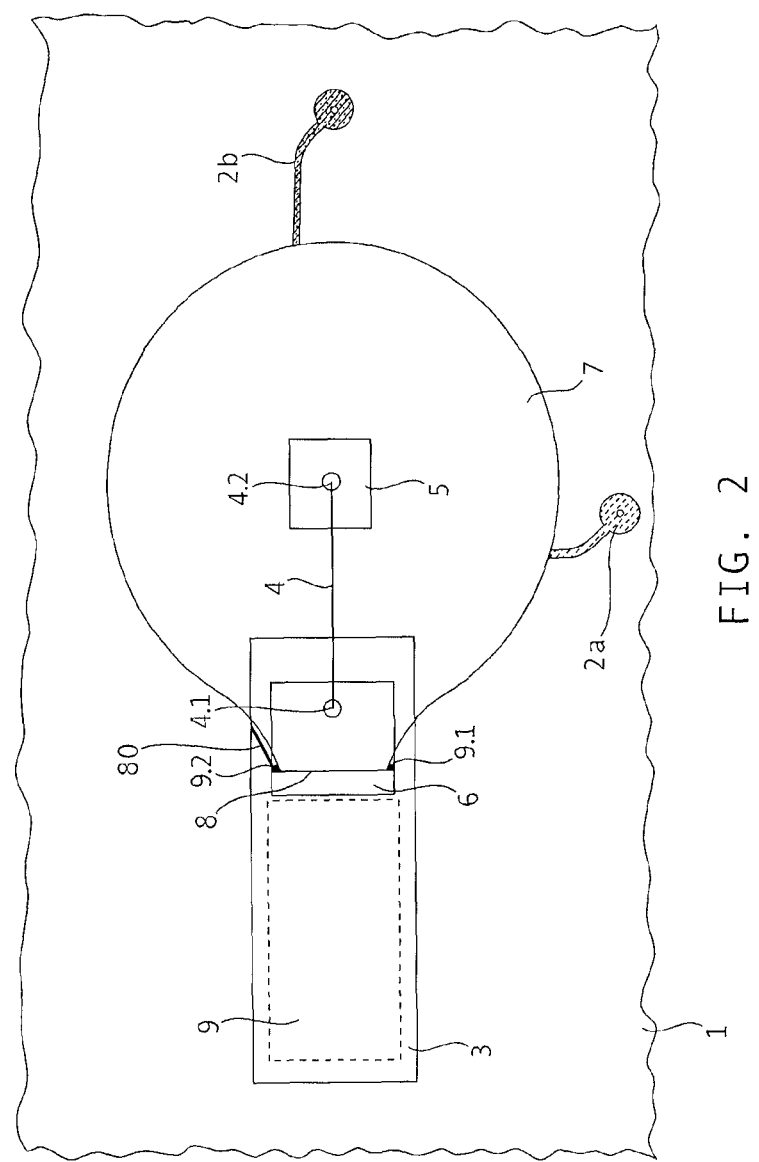
FIG. 2 is a top view of the component assembly of FIGS. 1a and 1b.

In FIGS. 1a and 1b, sectional views of a first embodiment of the component assembly of the invention are shown. FIG. 2 shows a top view on this exemplary embodiment. A first variant of the component assembly of the present invention will be described below in conjunction with these Figures.

The further components, to be described below, of the component assembly of the present invention are disposed on a carrier element 1. The carrier element 1 in this example is embodied as a known printed circuit board of FR4 material. Alternatively, other materials can be considered for the carrier element 1, such as ceramic or flexible circuit board material, and so forth.

As shown in FIG. 2, metal conductor tracks 2a, 2b are disposed in or on the carrier element 1 and serve to make electrical contact for the semiconductor component 3, disposed on the carrier element 1, and possibly for further components. As the semiconductor component 3, in the exemplary embodiment shown, an unpackaged photocell with a rectangular base is provided, whose optically function-relevant zone 9, in the form of a radiation-sensitive face, is oriented away from the carrier element 1. However, instead of the photocell, some other semiconductor component 3 could be placed at this point on the carrier element 1. For instance, a semiconductor light source could also be provided, which has an optically function-relevant zone in the form of a radiation-emitting face, and so forth.

In the present exemplary embodiment, securing the semiconductor component 3 to the carrier element 1 is done via a soldering process. In the alternative, the semiconductor component 3 could be glued to the carrier element 1.

The semiconductor component 3 is electrically connected to an exposed contact face 5 on the top side of the carrier element 1 via a contact-making bonding wire 4 on the substrate-element-side contact face 5. As can be seen in FIGS. 1a-b and 2, the substrate-element-side contact 4.2 of the contact-making bonding wire 4 is located on contact face 5. The component-side contact face 6 for the component-side contact 4.1 of the contact-making bonding wire 4 is located on the top side of the semiconductor component 3. The contact faces 5, 6 are each embodied as metallized, in the known manner.

For protecting the bonding wire connection, an encapsulation 7 includes a suitable encapsulation material, is disposed in the vicinity of the contact faces 5, 6. The contact-making bonding wire 4 is embedded entirely in the encapsulation 7 here and thus protected against mechanical effects and environmental factors. Also, in this variant, the encapsulation 7 completely covers the substrate-element-side contact face 5 of the contact-making bonding wire 4; the component-side contact face 6 of the bonding wire is covered only partly by the encapsulation 7—as will be described below.

Encapsulation materials with a high filling density are preferably used as the material for the encapsulation 7.

Particularly in the case of an optoelectronic semiconductor component 3, which as in the present example has an optically function-relevant zone 9 in the form of a radiation-sensitive face on its top side, it must now be reliably ensured that the encapsulation 7, after being applied, does not cover the optically function-relevant zone 9. Before hardening, the encapsulation 7 is limited, if at all possible, to the remaining zone of the top side of the semiconductor component, in which the contact-making bonding wire 4 is in contact with the component-side contact face 6. The spreading of the encapsulation material on the carrier element 1 in other directions, by comparison, is not so critical and can be suitably controlled in a known manner by suitable metering and choice of the solder material and/or by the suitable embodiment of a solder resist on the carrier element 1.

To prevent an uncontrolled flow of the encapsulation material over the top side of the semiconductor component 3, at least one flow stop bonding wire 8 is disposed according to the present invention in the boundary zone between the semiconductor component 3 and the encapsulation 7, or at the boundary between the encapsulation surface and the component-side contact face 6 of the semiconductor component 3. As can be seen from FIGS. 1*a-b* and 2, the flow stop bonding wire 8, in the example shown, is disposed at approximately a 90° angle from the contact-making bonding wire 4 and extends over the majority of the width of the semiconductor component 3 in that zone. In principle, other angles of disposition between the flow stop bonding wire 8 and the contact-making bonding wire 4 would also be possible, as an alternative to the example shown.

In the present example shown in FIGS. 1*a-b* and 2, the flow stop bonding wire 8 is disposed on the component-side contact face 6 of the contact-making bonding wire 4 in such a way that the component-side contact 4.1 of the contact-making bonding wire 4 is located with its contact face 6 between the flow stop bonding wire 8 and the edge of the semiconductor component 3. One side of flow stop bonding wire 8 defines on contact face 6 an encapsulation material free zone that includes the optically function relevant zone 9. The other side of the flow stop bonding wire 8 defines another zone on the contact face 6 that receives the encapsulation material that is applied to contact face 5. In this way, the encapsulation 7 after its application is prevented from flowing in the direction of the optically function-relevant zone 9 of the semiconductor component 3 employed and possibly covering it. To that end, the ridge embodied by the flow stop bonding wire 8 extends outward on the top side of the semiconductor component 3; at this ridge, or at the flow stop bonding wire 8, the further flow of the encapsulation material stops, and the optically function-relevant zone 9 of the semiconductor component 3 remains uncovered by the encapsulation. The flow stop bonding wire 8 in this example has a diameter in the range from 15 µm to 40 µm, so that an edge with a height of between 15 µm and 40 µm forms for the encapsulation material flowing in that direction.

The flow stop bonding wire 8 preferably has the same diameter as the contact-making bonding wire 4; in the same way, the same material is used for both bonding wires, such as aluminum or some other suitable bonding wire material. For that reason, the contact-making bonding wire 4 and the flow stop bonding wire 8 can be applied in an identical bonding process, which definitively simplifies the production of the component assembly of the present invention. In particular, for applying the flow stop, a separate and thus complicated masking process with one or more metallizing steps is no longer necessary. Also in this exemplary embodiment, compared to versions with flow stop means embodied as dams, additional components on the carrier element 1 are eliminated; that is, by comparison there is more space available on the carrier element 1.

The flow stop bonding wire 8 in this exemplary embodiment is fixed on both ends 9.1, 9.2. This can mean, as in the present example, that the two ends 9.1, 9.2 of the flow stop bonding wire 8 are fixed on the top side of the semiconductor component 3, or of the component-side contact face 6. Alternatively, however, a fixation can also be done outside the contact face 6 on the top side of the semiconductor component, for instance on further contact faces, directly on the top side of the semiconductor component 3 or on contact faces of the carrier element 1.

As can be seen from FIG. 1*b*, in the exemplary embodiment described, the flow stop bonding wire 8 rests over its full length on the contact face 6. However, this is not absolutely necessary. For example, it would also be possible for the flow stop bonding wire 8 to be in contact with the contact face 6 only on its two fixed ends 9.1, 9.2, and to extend above the contact face 6 slightly in the zone between them. In this respect, care should be taken that the flow stop bonding wire is not disposed too high above the contact face 6, so as not to threaten the flow stop action on the encapsulation material.

Besides the embodiment of a component assembly described, it is understood that alternative variant embodiments also exist within the scope of the present invention.

For instance, it is also possible to provide a plurality of suitably disposed flow stop bonding wires in conjunction with one semiconductor component. This may be necessary for instance if adequate flow stop action is not attainable with only a single flow stop bonding wire, or if a seal over a contact-making bonding wire is necessary on more than one side of a semiconductor component. Note that a possible second flow stop bonding wire 80 is shown in FIG. 2, wherein the flow stop bonding wire is schematically shown in that no particular size or orientation for the flow stop wire 80 is denoted. In other words, the drawing of flow stop wire 80 is merely made to show that a second flow stop wire 80 is present in conjunction with flow stop bonding wire 8.

Moreover, if needed, a thicker wire could be used as the flow stop bonding wire, compared to the contact-making bonding wire used, so as in this way to embody a more-massive flow stop if needed; wire thicknesses between 15 µm and 500 µm would be possible here.

Moreover, it could be provided that a flow stop bonding wire of this kind be disposed not only in the boundary zone with the semiconductor component, but that one or more flow stop bonding wires be disposed in other directions on the carrier element in the vicinity of the encapsulation as well, so as in that way to prevent an uncontrolled flow of the encapsulation material in these directions. The solder material above such further flow stop bonding wires can then reliably be limited in a certain zone to the carrier element.

One possible embodiment of the method of the present invention for producing a component assembly in accordance with the exemplary embodiment described above will now be described in conjunction with FIGS. 3*a*-3*d*.

Figure 3A:
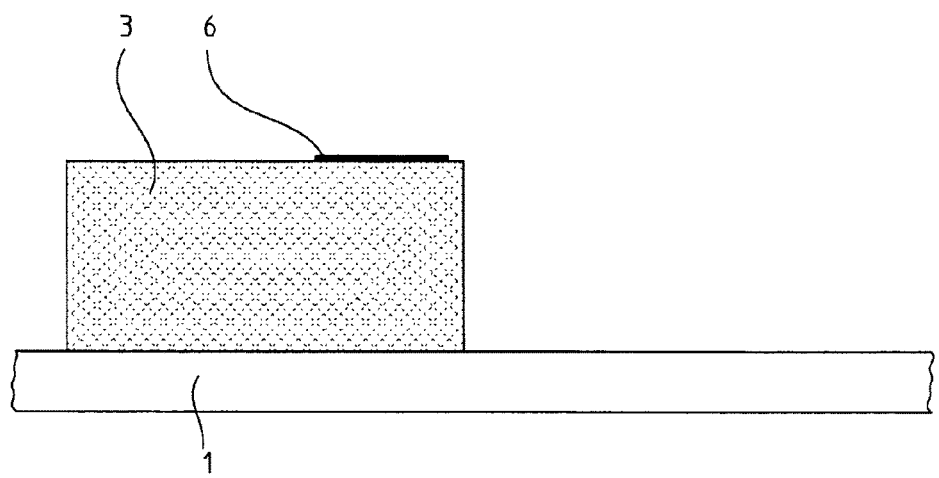
FIGS. 3a-3d each show one method step in the context of an example of a method for producing the component assembly of FIGS. 1a-b and 2 in accordance with the present invention.

In a first process step, shown in FIG. 3*a*, first the semiconductor component 3 is disposed on the carrier element 1. Preferably, soldering or gluing of the semiconductor component 3 to the carrier element 1 is done here.

Figure 3B:
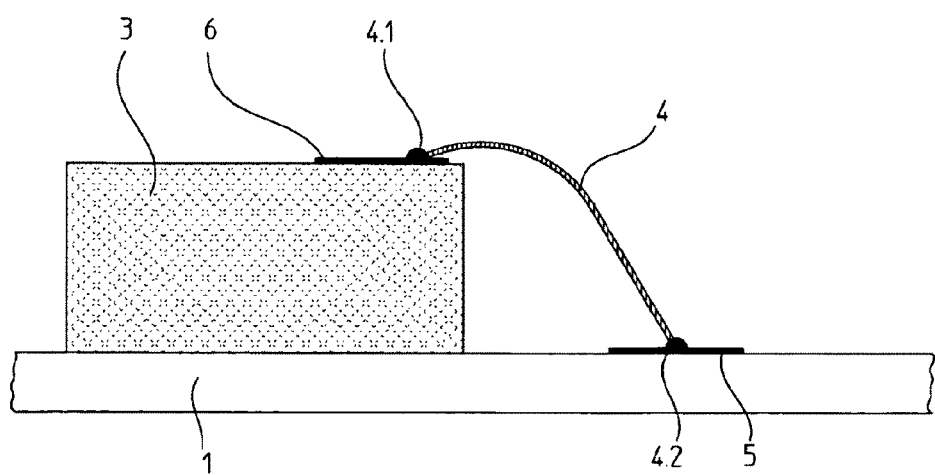

Next, as in FIG. 3*b*, the semiconductor component 3 is provided with an electrical contact via a known bonding process. In the context of the wire bonding process preferably employed here, a contact-making bonding wire 4 is connected in a well known manner to the substrate-element-side contact face 5 and the component-side contact face 6, and in that way the electrical contacts 4.1, 4.2 of the contact-making bonding wire 4 with the component 3 and the carrier element 1 are embodied.

Figure 3C:
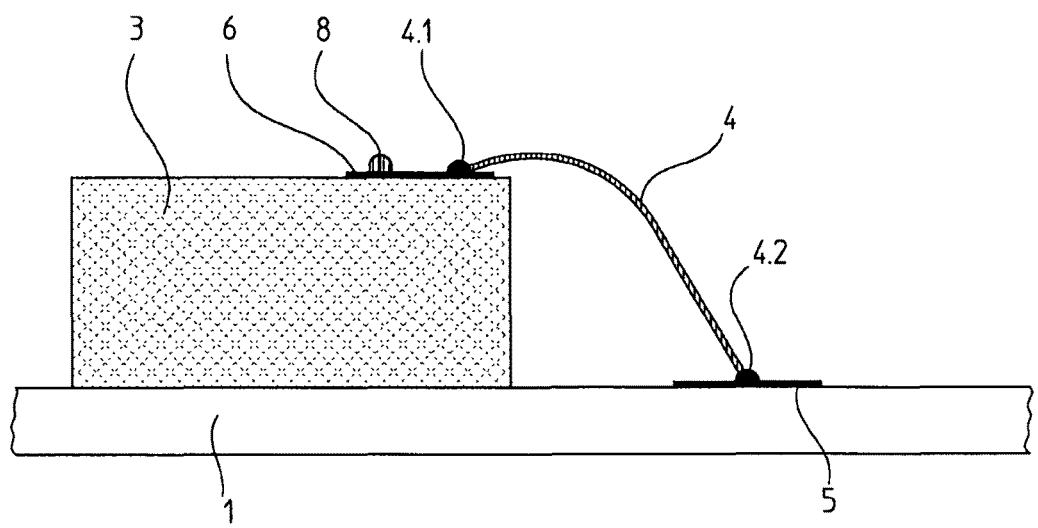

Via the same bonding process, next as shown in FIG. 3*c*, the flow stop bonding wire 8 acting as a flow stop is disposed on the top side of the semiconductor component 3, or on the component-side contact face 6. As described above, the flow stop bonding wire 8 is disposed essentially at right angles to the contact-making bonding wire 4 and is fixed at least at its two ends.

The application of the flow stop in the form of at least one flow stop bonding wire 8 is accordingly effected according to the present invention in the same bonding process as the application of the contact-making bonding wire 4. The result is considerable simplification of the process.

It is understood that alternatively to the example described, it is also possible to apply the flow stop bonding wire 8 first, and only then to apply the contact-making bonding wire 4.

Figure 3D:
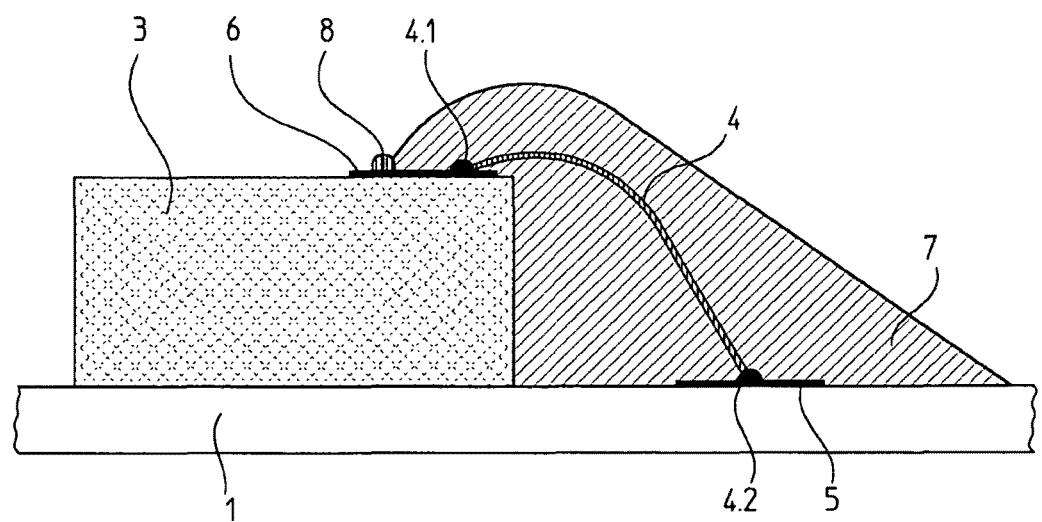

In closing, as shown in FIG. 3*d*, the encapsulation 7, or the corresponding encapsulation material, is finally applied in the zone of the substrate-element-side contact face 5 and the component-side contact face 6 of the contact-making bonding wire 4, so that the contact-making bonding wire 4 is entirely embedded in the encapsulation 7 and mechanically protected. By way of the previously applied flow stop bonding wire 8, the encapsulation material, before it hardens, is reliably prevented from flowing in an uncontrolled fashion into the optically function-relevant zone of the semiconductor component 3.

Also in the context of the method of the present invention, it is understood that various modifications of the procedure described are conceivable.

Figure 4:
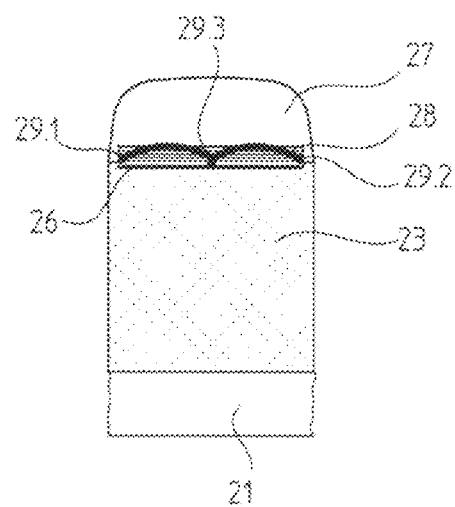
FIG. 4 is a schematic sectional view of a second exemplary embodiment of a component assembly in accordance with the present invention.

A second exemplary embodiment of the component assembly of the present invention is shown in FIG. 4 in a sectional view, analogously to the sectional view of FIG. 1*b*. In a distinction from the exemplary embodiment described above, it is now provided that the flow stop bonding wire 28 is fixed not only at the two ends 29.1, 29.2 on the component-side contact face 26 of the semiconductor component 23, but additionally at a further point 29.3 on the component-side contact face 26 of the semiconductor component 23. As a result, it can be ensured even more reliably that no solder material will flow underneath the flow stop bonding wire 28 in the direction of the face of the semiconductor component that is supposed to be kept exposed. In the context of this embodiment, it would also be conceivable for the flow stop bonding wire to be fixed at even more than one point, in addition to at the ends. Moreover, it could be provided that a flow stop bonding wire of the second embodiment be disposed parallel to a flow stop bonding wire of the first embodiment, and so forth.

One of ordinary skill would readily understand from the previous passages that the flow stop bonding wires 8 of FIGS. 1*a*-3*d* are arranged such that their entire length is positioned on the top surface of the semiconductor component 3.

Figure 5:
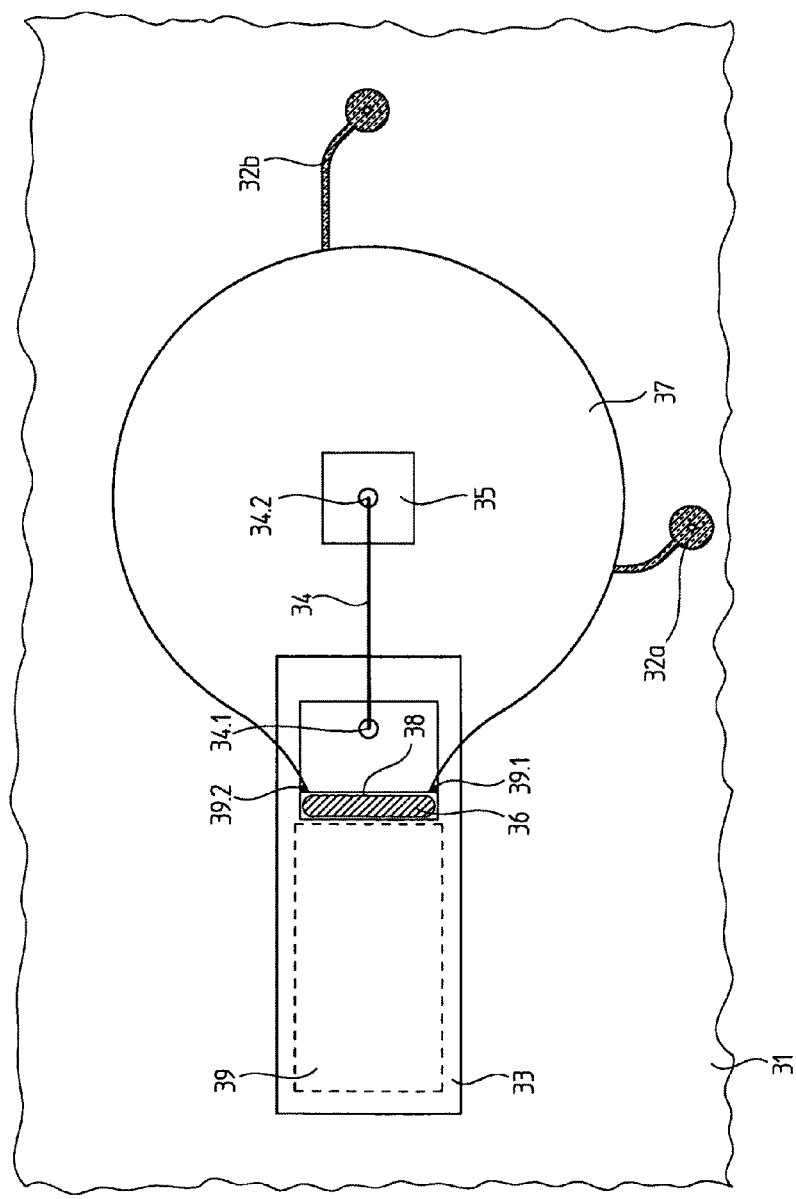
FIG. 5 is a top view of a third exemplary embodiment of a component assembly in accordance with the present invention.

FIG. 5 shows a top view on a third exemplary embodiment of the component assembly of the present invention. As in the first example shown, once again a flow stop bonding wire 38 is provided, by way of which flowing of the encapsulation 37 in the direction of the optically function-relevant zone 39 of the semiconductor component 33 is to be prevented. In addition to the flow stop bonding wire 38, in this embodiment a dam 36, as a further flow stop, is embodied on the component-side contact face 36 of the semiconductor component 33. The dam 36 is bounded on one side, namely on the side toward the encapsulation 37, by the flow stop bonding wire 38. As a result of this construction, compared to using merely a flow stop bonding wire, an even more-improved protection of the zone 39, that is, a better-optimized flow stop, can be embodied. A high-viscosity dam material is contemplated as the material for the dam 36 and is applied in the known manner to the appropriate point.

Besides the exemplary embodiments described concretely, it is understood that still other possible embodiments are within the scope of the present invention.

I claim:

1. A component assembly, comprising
a carrier element comprising a first contact face;
an optoelectronic semiconductor component disposed on said carrier element, wherein said optoelectronic semiconductor component comprising a second contact face;
a contact-making bonding wire, wherein one end of said contact-making bonding wire is connected to said first contact face and a second end of said contact-making bonding wire is connected to said second contact face;
a flow stop bonding wire positioned on said second contact face, wherein said flow stop bonding wire defines on said second contact face a first zone and a second zone with an optically function-relevant zone of said optoelectronic semiconductor component, and wherein said contact-making bonding wire and said flow stop bonding wire 1) comprise an identical material, 2) have an identical diameter, and 3) are applied in an identical bonding process; and
an encapsulation material applied from said first zone to said first contact face so as to define an encapsulation for said flow stop bonding wire, wherein said flow stop bonding wire prevents a flow of said encapsulation material into said second zone.

2. The component assembly of claim 1, wherein said flow stop bonding wire is disposed in a first direction; and said component assembly further comprises a second flow stop bonding wire is disposed in a second direction that is different from said first direction, wherein said second flow stop bonding wire prevents a flow of said encapsulation material on said carrier element in said second direction.

3. The component assembly of claim 1, wherein said flow stop bonding wire is disposed parallel to a side of said optoelectronic semiconductor component that is oriented toward said encapsulation material.

4. The component assembly of claim 1, wherein said optoelectronic semiconductor component is a photocell.

5. The component assembly of claim 1, wherein said encapsulation covers said first and second ends of said contact-making bonding wire.

6. The component assembly of claim 1, further comprising a dam disposed on said second face and is bounded on one side by said flow stop bonding wire.

7. The component assembly of claim 1, wherein said second contact face is a top side of said optoelectronic semiconductor component.

8. The component assembly of claim 7, wherein said second end of said contact-making bonding wire is disposed between said flow stop bonding wire and an edge of said optoelectronic semiconductor component.

9. The component assembly of claim 1, wherein said flow stop bonding wire comprises a first fixed end and a second fixed end.

10. The component assembly of claim 9, wherein said flow stop bonding wire comprises a point between said first fixed end and said second fixed end, wherein said point is fixed on said second contact face.

11. The component assembly of claim 1, wherein said flow stop bonding wire comprises a first end and a second end that are disposed on said second contact face.

12. The component assembly of claim 11, wherein said flow stop bonding wire comprises a portion between said first end and said second end that is unattached so that an unoccupied space is defined between said portion and said second contact face.

13. A component assembly, comprising
a carrier element comprising a first contact face;
an optoelectronic semiconductor component disposed on said carrier element, wherein said optoelectronic semiconductor component comprising a second contact face;
a contact-making bonding wire, wherein one end of said contact-making bonding wire is connected to said first contact face and a second end of said contact-making bonding wire is connected to said second contact face;
a flow stop bonding wire positioned on said second contact face, wherein said flow stop bonding wire defines on said second contact face a first zone and a second zone with an optically function-relevant zone of said optoelectronic semiconductor component, and wherein said contact-making bonding wire and said flow stop bonding wire 1) comprise an identical material, 2) have an identical diameter, and 3) are applied in an identical bonding process; and
an encapsulation material applied from said first zone to said first contact face so as to define an encapsulation for said flow stop bonding wire, wherein said flow stop bonding wire prevents a flow of said encapsulation material into said second zone; and
wherein said flow stop bonding wire comprises a first fixed end and a second fixed end so that said bonding wire is disposed above said second contact face at a height so as not to threaten flow stop action on said encapsulation material.

14. The component assembly of claim 13, wherein said flow stop bonding wire is disposed in a first direction; and said component assembly further comprises a second flow stop bonding wire is disposed in a second direction that is different from said first direction, wherein said second flow stop bonding wire prevents a flow of said encapsulation material on said carrier element in said second direction.

15. The component assembly of claim 13, wherein said flow stop bonding wire comprises a first fixed end and a second fixed end.

16. The component assembly of claim 13, wherein said flow stop bonding wire is disposed parallel to a side of said optoelectronic semiconductor component that is oriented toward said encapsulation material.

17. The component assembly of claim 13, wherein said optoelectronic semiconductor component is a photocell.

18. The component assembly of claim 13, wherein said encapsulation covers said first and second ends of said contact-making bonding wire.

19. The component assembly of claim 13, wherein said second contact face is a top side of said optoelectronic semiconductor component.

20. The component assembly of claim 19, wherein said second end of said contact-making bonding wire is disposed between said flow stop bonding wire and an edge of said optoelectronic semiconductor component.

21. The component assembly of claim 13, wherein said flow stop bonding wire comprises a first end and a second end that are disposed on said second contact face.

22. The component assembly of claim 21, wherein said flow stop bonding wire comprises a portion between said first end and said second end that is unattached so that an unoccupied space is defined between said portion and said second contact face.

* * * * *